(12) United States Patent
Sahaida et al.

(10) Patent No.: US 7,741,155 B2
(45) Date of Patent: Jun. 22, 2010

(54) METHOD OF MANUFACTURING SEMICONDUCTING DEVICE WITH STACKED DICE

(75) Inventors: Scott R. Sahaida, El Dorado Hills, CA (US); Iwen Chao, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 40 days.

(21) Appl. No.: 12/148,874

(22) Filed: Apr. 22, 2008

(65) Prior Publication Data
US 2008/0280395 A1 Nov. 13, 2008

Related U.S. Application Data

(62) Division of application No. 10/815,966, filed on Mar. 31, 2004, now Pat. No. 7,378,725.

(51) Int. Cl.
*H01L 21/58* (2006.01)
(52) U.S. Cl. ............... 438/109; 438/125; 257/E21.505
(58) Field of Classification Search ........... 257/E23.003
See application file for complete search history.

(56) References Cited

U.S. PATENT DOCUMENTS

2002/0140073 A1* 10/2002 Pai et al. .................... 257/686
2002/0195697 A1* 12/2002 Mess et al. .................. 257/686

* cited by examiner

*Primary Examiner*—Stephen W Smoot
(74) *Attorney, Agent, or Firm*—Kenneth A. Nelson

(57) ABSTRACT

Some embodiments of the present invention relate to a semiconducting device and method that include a substrate and a first die that is attached to the substrate. The first die includes active circuitry (e.g., a flash memory array or logic circuitry) on an upper surface of the first die. The semiconducting device further includes a spacer that covers the active circuitry on the upper surface of the first die and a second die that is stacked onto the spacer and the first die. The spacer extends from a first side of the first die to an opposing second side of the first die. The spacer also extends near a third side of the first die and an opposing fourth side of the first die such that the active circuitry is exposed near the third and fourth sides of the first die.

9 Claims, 5 Drawing Sheets

METHOD OF MANUFACTURING SEMICONDUCTING DEVICE WITH STACKED DICE

CLAIM OF PRIORITY

This application is a divisional of U.S. patent application Ser. No. 10/815,966 which was filed on Mar. 31, 2004 and which issued as U.S. Pat. No. 7,378,725 on May 27, 2008.

TECHNICAL FIELD

Some embodiments of the present invention relate to a semiconducting device, and in particular, to a semiconducting device that includes stacked dice, and to manufacturing methods related thereto.

BACKGROUND

High performance semiconducting devices are continuously being redesigned in order to increase processing speed and/or power. Each increase in processing speed and power generally carries a cost of increased size such that additional innovations must be made in order to minimize the size of the semiconducting devices. Manufacturers of semiconducting devices continually try to improve product performance and reduce product size while minimizing production costs.

Several methods have been employed to minimize the size of semiconducting devices. One method includes stacking multiple dice onto a substrate that electrically connects one or more of the stacked dice to other electronic components which make up part of an electronic system.

Some of the dice within the stack may include active circuitry that is exposed on the upper surface of the die (e.g., a flash memory array). The active circuitry on the upper surface of the die is slightly larger (e.g., approximately 1 mm) than the spacer on all four sides of the spacer such that wires can be bonded to the active circuitry on all four sides of the spacer.

One drawback with such a spacer design is that the spacer places the exposed active circuitry under stress that varies relative to the position of the active circuitry on the die, especially where the active circuitry coincides with the edges of the spacer. The varying stress at different positions across the upper surface of the die causes the transconductance (gm) of the die to change at different positions on the die.

In an example semiconducting device where the active circuitry on the die includes a flash memory array the outer blocks of the flash memory array (i.e., those blocks near the edge of the spacer) are typically at a significantly different stress than the blocks near the center of the array. This variation in the stress causes a gm degradation on the outer blocks of the array relative to the center blocks due to the location of the edge of the spacer. The gm degradation of the outer blocks relative to the center blocks causes decreased program erase (P/E) cycling performance within the flash memory array.

In another example semiconducting device where the active circuitry on the die includes logic circuitry, there is also gm degradation due to the location of the edge of the spacer. The gm degradation may result in timing failures due to transistor current changes within the logic circuitry.

DETAILED DESCRIPTION

Figure 1:
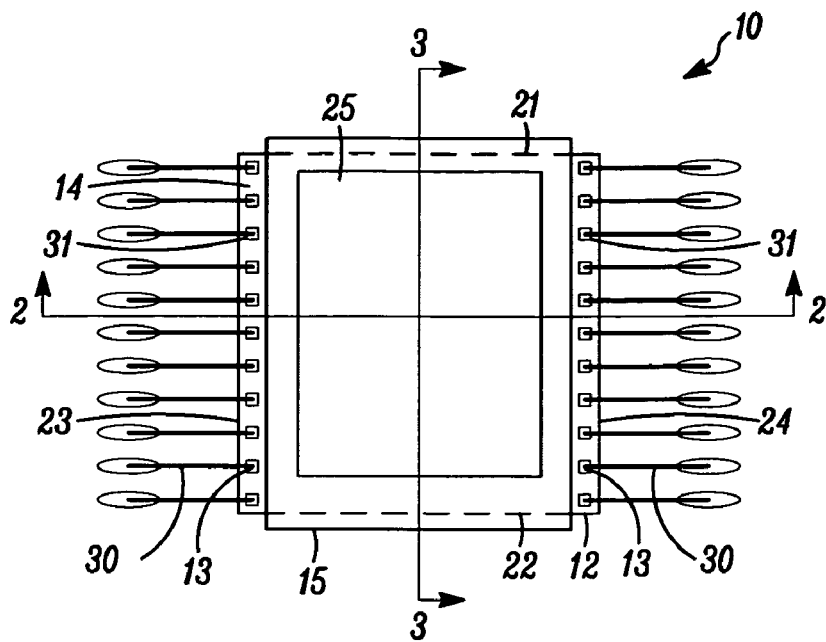
FIG. 1 is a schematic plan view of a semiconducting device that includes multiple dice stacked on a substrate.

In the following detailed description, reference is made to the accompanying drawings. In the drawings, like numerals describe substantially similar components throughout the several views. Other embodiments may be utilized, and structural, logical, and electrical changes may be made.

Figure 2:
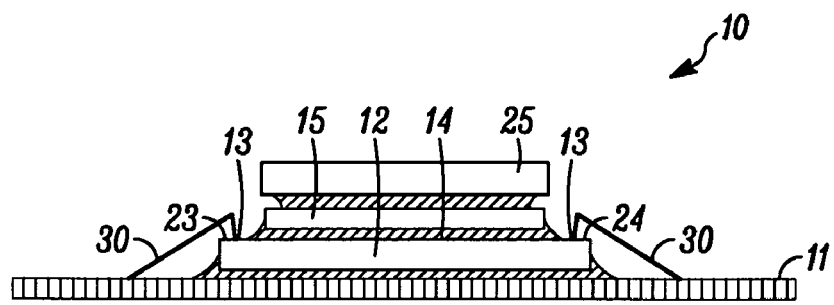
FIG. 2 is a schematic section view taken along line 2-2 of FIG. 1.
Figure 3:
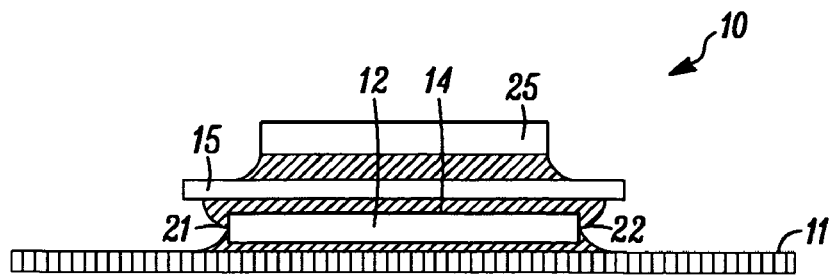
FIG. 3 is a schematic section view taken along line 3-3 of FIG. 1.

FIGS. 1-3 illustrate a semiconducting device 10 that includes a substrate 11 (shown in FIGS. 2 and 3) and a first die 12 that is attached to substrate 11. The first die 12 includes active circuitry 13 (e.g., a flash memory array or logic circuitry) on an upper surface 14 of the first die 12. Note that active circuitry 13 is only partially visible in FIGS. 1 and 2. The first die 12 may be secured to substrate 11 using an adhesive, conductive epoxy or some form of solder attachment (among other methods).

The semiconducting device 10 further includes a spacer 15 that covers the active circuitry 13 on the upper surface 14 of first die 12. Spacer 15 extends from a first side 21 of first die 12 to an opposing second side 22 of first die 12. Spacer 15 also extends near a third side 23 of first die 12 and an opposing fourth side 24 of first die 12 such that active circuitry 13 is exposed near the third and fourth sides 23, 24 of first die 12 (shown most clearly in FIG. 1). Although spacer 15 extends past the first and second sides 21, 22 of first die 12 in the example illustrated embodiments, it should be noted that spacer 15 may extend up to, or past, the first and/or second sides 21, 22 of first die 12 as long as the spacer reaches the first and second sides 21, 22.

In some example embodiments, spacer 15 may be about 0.3 mm to 1.5 mm away from the third and fourth sides 23, 24 of first die 12. In addition, spacer 15 may be made of silicon, although other materials may be used.

A second die 25 is stacked onto spacer 15 and first die 12. The second die 25 may be secured to spacer 15 using an adhesive, conductive epoxy or some form of solder attachment (among other methods).

Figure 4:
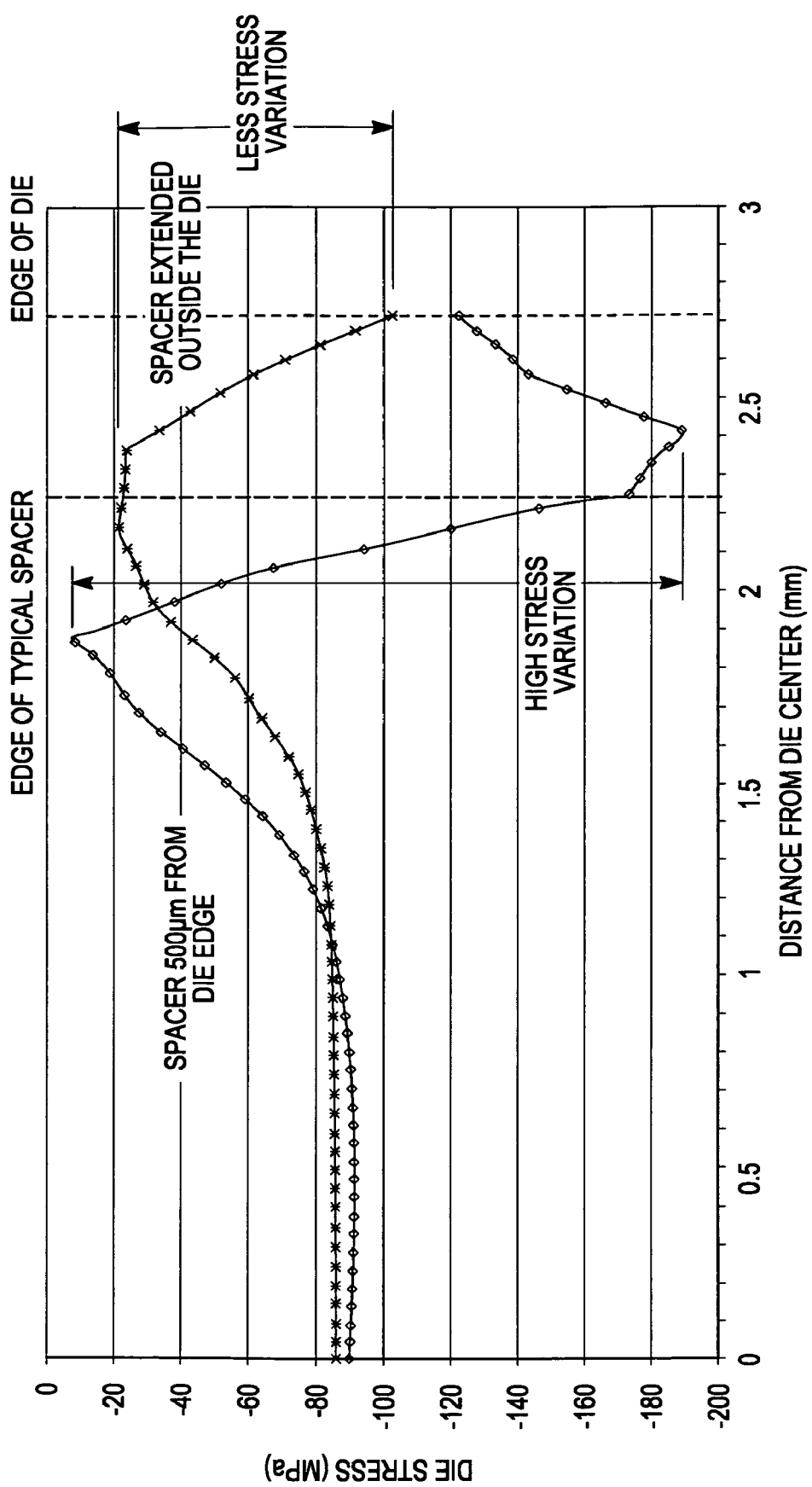
FIG. 4 illustrates die stress as a function of the distance from a centerline of the die to a first or second side of the die.

FIG. 4 illustrates the stress within first die 12 as a function of the distance from a centerline of first die 12 to the first or second sides 21, 22 of the first die 12. FIG. 4 compares the varying stress between an example embodiment that is similar to one shown in FIGS. 1-3 and a prior art design where the spacer is 1 mm smaller than the first die 12 and is 0.5 mm away from the edge of the first and second sides 21, 22.

When the spacer 15 extends to the first and second sides 21, 22 of first die 12, the change in the stress (i.e., delta) across the upper surface 14 of first die 12 is reduced as compared to a spacer that does not extend to the first and second sides. Minimizing the variance in the stress across the upper surface 14 of first die 12 reduces the gin degradation across first die 12 resulting in improved P/E cycling performance when active circuitry 13 is a flash memory array.

It should be noted that first and second dice 12, 25 may be encapsulated by any known procedure, such as molding and sealing. In addition, other fabrication processes such as wire bonding, lead bonding and bump bonding may be done to first and second dice 12, 25 prior to encapsulation. First and second dice 12, 25 may also be subjected to additional processes such as ball attaching and/or marking after encapsulation.

In some example embodiments, wires 30 may be bonded to pads 31 that are part of the exposed active circuitry 13 near the third and fourth sides 23, 24 of first die 12 (see FIGS. 1 and 2). Wires 30 may electrically couple first die 12 to substrate 11 and/or one or more other electronic components (not shown in FIGS. 1-3). It should be noted that any type of pad 31, or contact, may be used as long as wires 30 can be attached to pads 31. A number of materials may be used for wires 30 and pads 31. The choice of materials will depend on the relevant circuit design considerations and the costs that are associated with fabricating semiconducting device 10 (among other factors).

Figure 5:
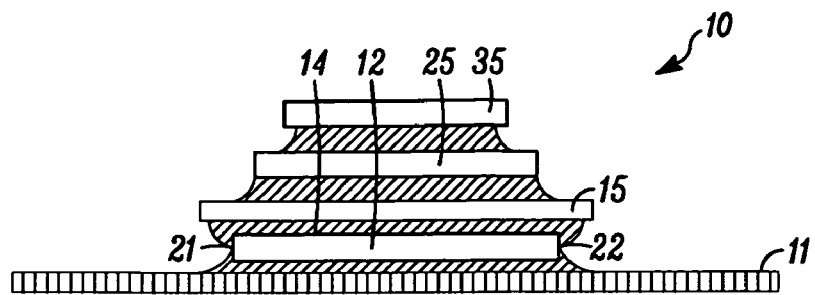
FIG. 5 is a schematic section view similar to FIG. 3 illustrating another example semiconducting device that includes a spacer and multiple dice stacked on a substrate.

In the example embodiment shown in FIG. 5, semiconducting device 10 further includes at least one additional die 35 that is stacked onto first die 12, spacer 15 and second die 25. Although only one die 35 is shown in FIG. 5, any number of dice and/or spacers may be stacked onto first die 12, spacer 15 and second die 25.

Figure 6:
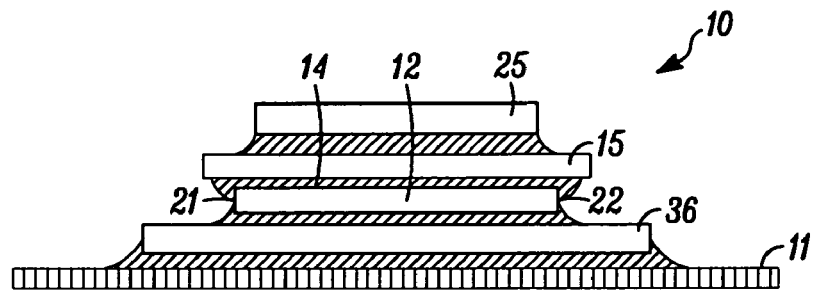
FIG. 6 is a schematic section view similar to FIGS. 3 and 5 illustrating another example semiconducting device that includes a spacer and multiple dice stacked on a substrate.

In the example embodiment shown in FIG. 6, semiconducting device 10 further includes at least one additional die 36 that is mounted on substrate 11 such that first die 12, spacer 15 and second die 25 are stacked onto the at least one additional die 36. Although only one die 36 is shown in FIG. 6, any number of dice and/or spacers may be mounted on substrate 11 between first die 12 and substrate 11.

Figure 7:
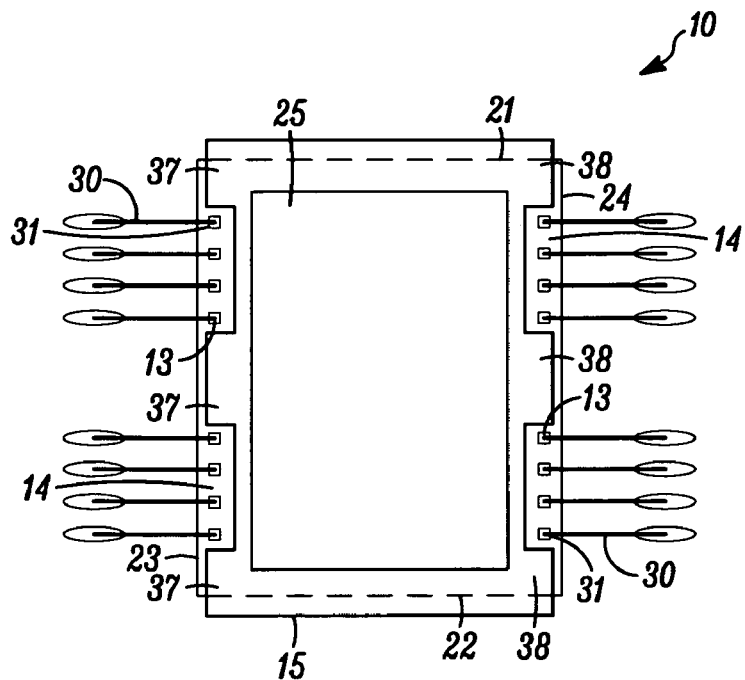
FIG. 7 is a schematic plan view similar to FIG. 1 illustrating another example semiconducting device that includes a spacer and multiple dice stacked on a substrate.

FIG. 7 shows that in some example embodiments, spacer 15 may include at least one section 37 that extends to the third side 23 of first die 12 such that active circuitry 13 is only partially exposed near the third side 23 of first die 12; and/or at least one section 38 that extends to the fourth side 24 of first die 12 such that active circuitry 13 is only partially exposed near the fourth side 24 of first die 12. It should be noted that the numbers of sections 37, 38 that extend to the respective third and fourth sides 23, 24 of first die 12 may vary in number, size and shape. In some embodiments, spacer 15 may extend to, or past, one of the third or fourth sides 23, 24 of first die 12 depending on the design of the semiconducting device 10.

Figure 8:
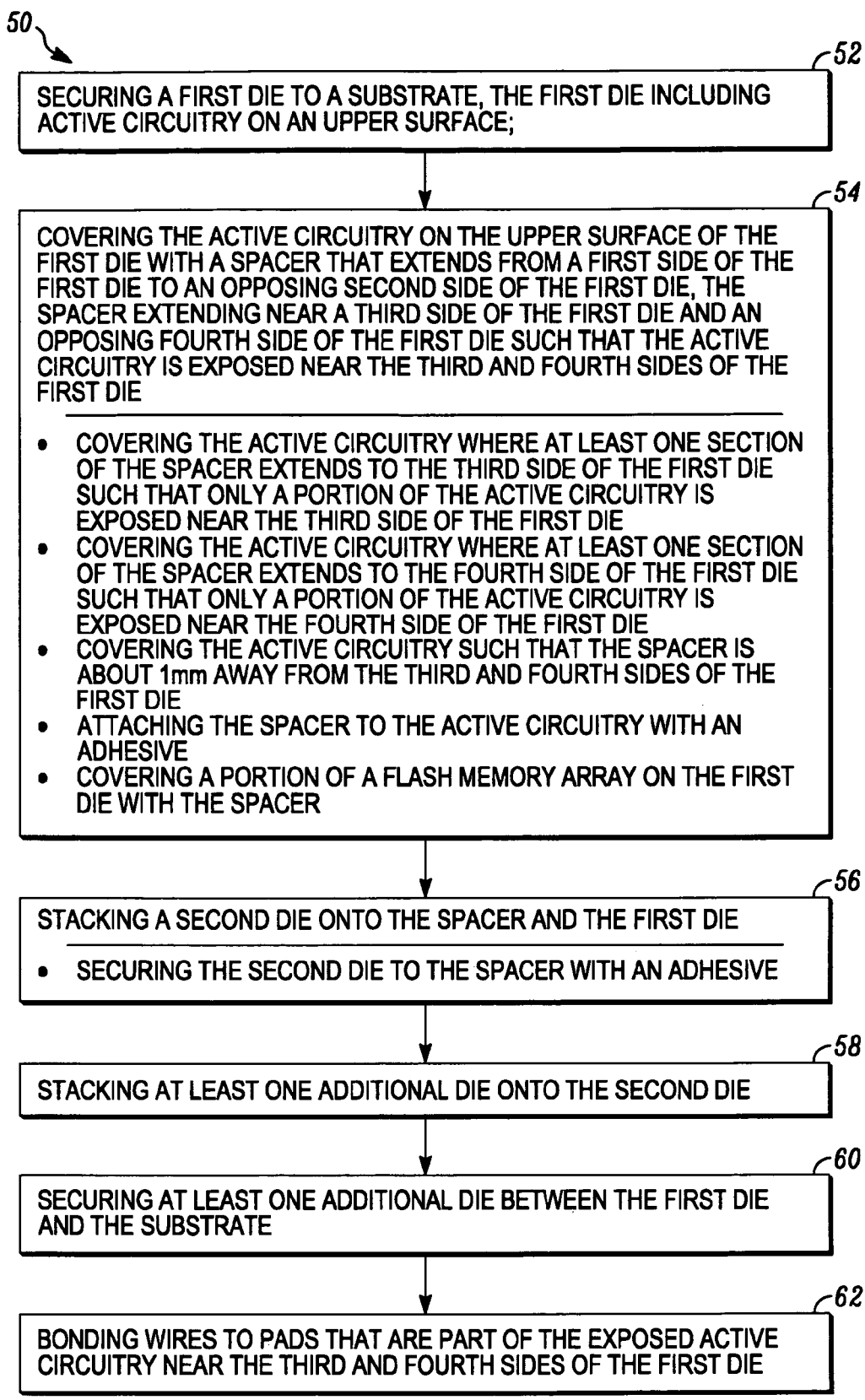
FIG. 8 illustrates a method of fabricating a semiconducting device that includes a spacer and multiple dice stacked on a substrate.

Referring now also to FIG. 8, an example method 50 of the present invention includes 52 securing a first die 12 to a substrate 11 where the first die 12 includes active circuitry 13 (e.g., a memory array or logic circuitry) on an upper surface 14 of first die 12. First die 12 may be secured to substrate 11 using solder or adhesives (among other methods). In addition, spacer 15 may be secured to active circuitry 13 on first die 12 using adhesives (among other methods).

The method 50 further includes 54 covering the active circuitry 13 on the upper surface 14 of first die 12 with a spacer 15 that extends from a first side 21 of first die 12 to an opposing second side 22 of first die 12. Spacer 15 also extends near a third side 23 of first die 12 and an opposing fourth side 24 of first die 12 such that active circuitry 13 is exposed near the third and fourth sides 23, 24 of first die 12.

The method 50 further includes 56 stacking a second die 25 onto spacer 15 and first die 12. In some forms, second die 25 may be secured onto spacer 15 using solder or adhesives (among other methods).

The method 50 may further include 58 stacking at least one additional die 35 onto second die 25 (see, e.g., FIG. 5); and/or 60 securing at least one additional die 36 between first die 12 and substrate 11 (see, e.g., FIG. 6). Although only one die 35 is shown in FIG. 5, and only one die 36 is shown in FIG. 6, any number of dice and/or spacers may be stacked onto first die 12, spacer 15 and second die 25, and/or between first die 12 and substrate 11.

In some example embodiments, 54 covering the active circuitry 13 on the first die 12 with a spacer 15 may include covering the active circuitry 13 such that spacer 15 is about 0.3 mm to 1.5 mm away from the third and fourth sides 23, 24 of first die 12; covering the active circuitry 13 where at least one section 37 of spacer 15 extends to the third side 23 of first die 12 such that only a portion of the active circuitry 13 is exposed near the third side 23 of first die 12 (see FIG. 7); and/or covering the active circuitry 13 where at least one section 38 of spacer 15 extends to the fourth side 24 of first die 12 such that only a portion of the active circuitry 13 is exposed near the fourth side 24 of first die 12 (see FIG. 7).

The method 50 may further include 62 bonding wires 30 to bond pads 31 that are part of the exposed active circuitry 13 near the third and fourth sides 23, 24 of first die 12. It should be noted that any type of bonding may be used to attach wires 30 to pads 31. The example steps and processes described with reference to FIG. 8 need not be performed in any particular order.

Figure 9:
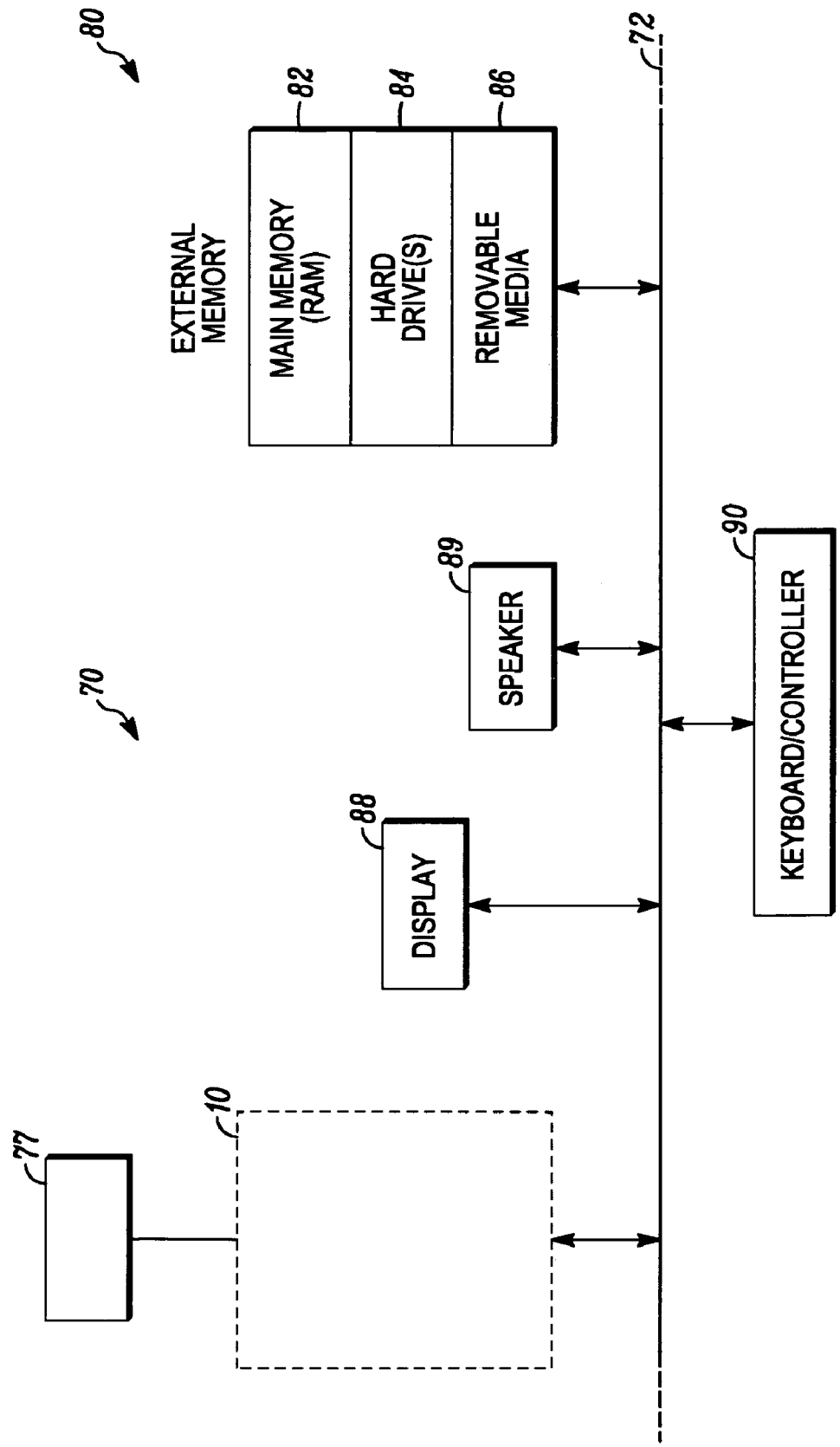
FIG. 9 is a block diagram of an electronic system that incorporates at least one semiconducting device or method of the type shown in FIGS. 1-8.

FIG. 9 is a block diagram of an electronic system 70, such as a computer system, that includes a semiconducting device 10 which is electrically coupled to various components in electronic system 70 via a system buss 72. Any of the semiconducting devices 10 described herein may be electrically coupled to system buss 72.

Semiconducting device 10 may include a microprocessor, a microcontroller, a graphics processor or a digital signal processor, memory, flash memory and/or a custom circuit or an application-specific integrated circuit, such as a communications circuit for use in wireless devices such as cellular telephones, pagers, portable computers, two-way radios, and similar electronic systems. System buss 72 may be a single buss or any combination of busses.

The electronic system 70 may also include an external memory 80 that in turn includes one or more memory elements suitable to the particular application, such as a main memory 82 in the form of random access memory (RAM), one or more hard drives 84, and/or one or more drives that handle removable media 86, such as floppy diskettes, compact disks (CDs) and digital video disks (DVDs).

The electronic system 70 may also include a display device 88, a speaker 89, and a controller 90, such as a keyboard, mouse, trackball, game controller, microphone, voice-recognition device, or any other device that inputs information into the electronic system 70.

In some embodiments, electronic system 70 may further include a voltage source 77 that is electrically coupled to semiconducting device 10. Voltage source 77 may be used to supply power one or more of the dice that are stacked within semiconducting device 10.

Semiconducting device 10 can be implemented in a number of different embodiments. The elements, materials, geometries, dimensions, and sequence of operations can all be varied to suit particular packaging requirements. Parts of some embodiments may be included in, or substituted for, those of other embodiments.

FIGS. 1-9 are merely representational and are not drawn to scale. Certain proportions thereof may be exaggerated while others may be minimized. Many other embodiments will be apparent to those of skill in the art.

The semiconducting device and method described above may provide a solution for stacking dice in semiconducting packages where at least one die in the stack of dice includes exposed active circuitry on an upper surface of the die. The spacer may reduce stress changes across the active circuitry on the die. The spacer may also provide circuit designers with the ability to reduce the effect of the spacer on P/E cycling performance when the spacer covers a flash memory array on one die in a stack of dice.

What is claimed is:

1. A method comprising:

securing a first die to a substrate, the first die including active circuitry on an upper surface; covering the active circuitry on the upper surface of the first die with a spacer that extends from a first side of the first die to an opposing second side of the first die, the spacer extending near a third side of the first die and an opposing fourth side of the first die such that the active circuitry is exposed near the third and fourth sides of the first die; and stacking a second die onto the spacer and the first die, wherein covering the active circuitry on the first die with a spacer includes covering the active circuitry where at least one section of the spacer extends to the third side of the first die such that only a portion of the active circuitry is exposed near the third side of the first die.

2. The method of claim 1, wherein stacking the second die onto the spacer and the first die includes securing the second die to the spacer with an adhesive.

3. The method of claim 1, further comprising stacking at least one additional die onto the second die.

4. The method of claim 1, further comprising securing at least one additional die between the first die and the substrate.

5. The method of claim 1, wherein covering the active circuitry on the first die with a spacer includes covering the active circuitry where at least one section of the spacer extends to the fourth side of the first die such that only a portion of the active circuitry is exposed near the fourth side of the first die.

6. The method of claim 1, wherein covering the active circuitry such that the spacer extends near a third side of the first die and a fourth side of the first die includes covering the active circuitry such that the spacer is about 1 mm away from the third and fourth sides of the first die.

7. The method of claim 1, wherein covering the active circuitry on the first die with a spacer includes attaching the spacer to the active circuitry with an adhesive.

8. The method of claim 1, wherein covering the active circuitry on the first die with a spacer includes covering a portion of a flash memory array on the first die with the spacer.

9. The method of claim 1, further comprising bonding wires to pads that are part of the exposed active circuitry near the third and fourth sides of the first die.

* * * * *